United States Patent [19]

Hattori et al.

[11] Patent Number: 4,480,261
[45] Date of Patent: Oct. 30, 1984

[54] CONTACT STRUCTURE FOR A SEMICONDUCTOR SUBSTRATE ON A MOUNTING BODY

[75] Inventors: Hirotsugu Hattori, Takatsuki; Masahiro Kuwagata, Suita, both of Japan

[73] Assignee: Matsushita Electronics Corporation, Kadoma, Japan

[21] Appl. No.: 390,113

[22] Filed: Jun. 18, 1982

[30] Foreign Application Priority Data

Jul. 2, 1981 [JP] Japan .............................. 56-104159

[51] Int. Cl.³ ...................... H01L 23/54; H01L 23/18
[52] U.S. Cl. ....................................... 357/71; 357/67; 357/65
[58] Field of Search ..................... 357/71, 67

[56] References Cited

U.S. PATENT DOCUMENTS

| | | | |
|---|---|---|---|
| 2,801,375 | 7/1957 | Losco | 357/71 X |
| 3,266,127 | 8/1966 | Harding et al. | 357/71 X |
| 3,381,256 | 4/1968 | Schuller et al. | 357/71 X |
| 3,386,894 | 6/1968 | Steppat | 357/71 X |
| 3,562,040 | 2/1971 | Garies | 357/71 X |
| 3,922,385 | 11/1975 | Konantz et al. | 357/71 X |
| 4,176,443 | 12/1979 | Iannuzzi et al. | 357/67 X |

FOREIGN PATENT DOCUMENTS

| | | | |
|---|---|---|---|
| 1858 | 1/1978 | Japan | 357/71 R |
| 127572 | 10/1979 | Japan | 357/71 R |

Primary Examiner—Martin H. Edlow
Assistant Examiner—S. V. Clark
Attorney, Agent, or Firm—Cushman, Darby & Cushman

[57] ABSTRACT

In bonding a semiconductor substrate onto a mounting means, a multiple layer metal electrode is formed on the surface, the multiple layer comprising at least a chromium-nickel alloy layer, nickel layer and a noble metal layer of a noble metal selected from a group consisting of gold, silver or platinum, which is bonded to a solder layer of Pb-Sn-alloy or Ag-Sb-Sn-alloy of the mounting means.

6 Claims, 1 Drawing Figure

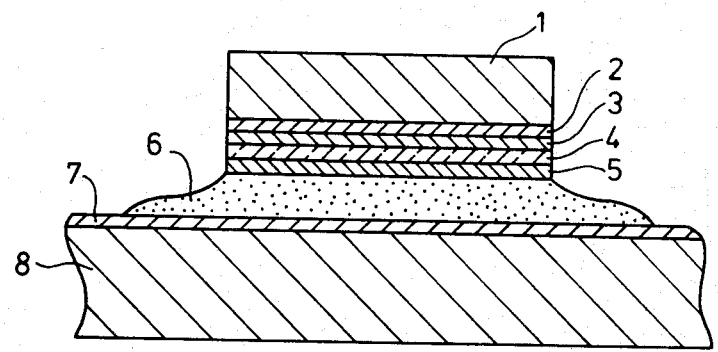

CONTACT STRUCTURE FOR A SEMICONDUCTOR SUBSTRATE ON A MOUNTING BODY

BACKGROUND OF THE INVENTION

1. Field of the Technology of the Invention

The present invention relates to an improvement in a semiconductor device wherein electrode construction and soldering layer construction to bond the semiconductor substrate onto a mounting means have an improved combination for attaining stronger bonding force and higher stability for long time of service.

2. Description of the Prior Art

Metal electrode layers which is provided on a surface of a semiconductor substrate, and surface of which is to be bonded with a solder layer onto a mount should fulfil such characteristics that:

(1) the metal electrode layer contacting the solder layer has a good wetting with the latter, (2) in the soldering process, the ingredient of the metal electrode layer contacting the solder layer substantially does not melt into the solder layer, and the metal electrode layer hardly peels off from the semiconductor substrate, (3) the metal electrode layer contacting the solder layer has a strong bonding force to the latter, (4) the metal electrode layer is stable and has a high reliability against a long-time hard testing such as thermal fatigue testing, and (5) undesirable compound between the solder layer and the metal electrode layer is hardly made in the soldering process.

On the other hand, the solder should have characteristics that:

(1) it is easy to bond therewith, (2) the solder has a good wetting with the semiconductor substrate, making no voids, (3) the solder has a good electric conductivity, (4) the solder has a good thermal conductivity, (5) the solder is less oxidized by atmospheric gas, and (6) the solder has good durability against thermal fatigue.

That is, the solder for the semiconductor substrate bonding, must not only have good physical and chemical characteristics, but also provide the semiconductor device with good electrical and thermal characteristics. In other words it is to be noted that, in bonding a semiconductor substrate on a mounting means together with substances of the electrode layers the solder substance as such gives a great effect to the bonding. Accordingly, in the soldering, consideration on materials should be made, not only on the electrodes of the semiconductor substrate, but also from a all-over view as a combination with the solder substance. Especially for semiconductor devices to handle large electric powers like power transistors or like ones, it is important to select the materials by considering the brittleness after time lapse, in order to realize a satisfactory resistivity to thermal fatigue.

Hitherto, nickel-plated layers formed by electrolytic process or non-electrolytic process, or nickel layer formed by vacuum deposition process have been used as electrode layers to be bonded by solder. Nickel is superior for this purpose since it does not melt into the solder layer, but has a problem that it requires a heat treatment at a relatively high temperature in order to attain a strong bonding force to the semiconductor substrate. When a nickel layer is formed by a plating, it is necessary to carry out a troublesome pretreatment in order to get excellent adhesive force to substrate surface, and moreover the plated surface is likely to be contaminated by impurities in a plating bath. In order to obtain a good ohmic contact, a predetermined impurity is necessary in a contact region of the substrate to form the nickel layer thereon. And therefore, there is a problem that a diffusing process is necessary to form the contact region with the impurity.

In order to utilize the good characteristics of nickel for soldering, composite layers of chromium-nickel alloy and nickel or composite layers of chromium, chromium-nickel alloy and nickel have been developed and known as multiple layer electrode. However, even with the uses of such multiple layer electrode, it is not sufficient for attaining a stable and uniform bondings between the semiconductor substrate and the mount. In other words, even though such multiple layer electrodes are usable for actual uses, there is a problem of oxidation of nickel surface of the multiple layer electrodes in a mass-production line, where there is some waiting time between the electrode formation and subsequent solder bonding for devices in some lots. Therefore, ordinarily, some suitable surface treatment has been made in order to avoid undesirable influence of oxidation of surface nickel layer during the wasting time and obtain uniform products. This means an increase of a step, the surface treatment, which necessitates another control of its condition; and even with such treatment, voids are often observed at soldering. In view of the above-mentioned discussion, it is desirable to omit such surface treatment which is immediately before the soldering. And it is further considered that to form the nickel layer as the surface layer (uppermost layer) as such induces many problems.

SUMMARY OF THE INVENTION

The present invention purports to provide a semiconductor device having a satisfactory bonding between a semiconductor substrate and a metal mount.

The present invention can provide a semiconductor device with a good uniformity of bonding between the semiconductor substrate and the mounting means in a mass-production line.

A semiconductor device in accordance with the present invention comprises a semiconductor substrate, a multilayered electrode formed on a surface of the semiconductor substrate, the multilayered electrode comprising a chromium-nickel alloy layer formed on the surface, a nickel layer formed thereon and a noble metal layer of a metal selected from a group consisting of gold, silver and platinum formed further thereon, a solder layer and a mounting means for holding the semiconductor substrate thereon, the solder layer soldering the multilayered electrode onto the mounting means thereby bonding the semiconductor substrate onto the mounting means.

The multilayered metal electrode structure used in the semiconductor device in accordance with the present invention has the features: that there is substantially no voids at the solder layer as a result of good wetting of the noble metal to the solder layer, that effective bonding area increases as a result of decrease of voids, resulting in decrease of thermal resistance by 10 to 20%, that secondary breakdown voltage increases by about 10% thereby increasing reliability, that bonding force is drastically increased, that control of manufacturing in the soldering step becomes easier, that formation of Sn-Ni compound is suppressed thereby improving resistivity to thermal fatigue, and that oxidation of the surface of the multilayered electrode is eliminated thereby enabling dispensing with of necessity of the preliminary treatment before the soldering.

BRIEF EXPLANATION OF THE DRAWING

The drawing is a sectional elevation view of an example of a semiconductor device embodying the present invention.

DESCRIPTION OF THE PREFERRED EMBODIMENT

The present invention is hereinafter elucidated in reference to a preferred embodiment configuration of which is shown in FIG. 1, wherein a semiconductor substrate 1 comprises on its one surface (bottom surface in this example), a chromium layer 2, a chromium-nickel alloy layer 3, a nickel layer 4 and a noble metal layer 5, in this order. The noble metal layer 5 is then bonded on a solder layer 6 which is formed on a metal plated layer 7 on a surface of a mounting means 8.

The above-mentioned device construction is made in the following process.

First, on the surface of the substrate 1 at the side to be bonded on the mounting means 8, a multilayered metal electrode of 500Å thick chromium layer 2, 500Å thick chromium-nickel alloy layer 3 and 3000Å thick nickel layer 4 are formed in a consecutive vapor deposition in this order, by for example, multiple source electron-beam vapor deposition apparatus, without breaking a vacuum. The lowermost Cr layer 2 serves to highly strengthen the bonding force between the metal electrode and the semiconductor substrate 1, for instance, silicon substrate, the second Cr-Ni-alloy layer 3 serves to bond the underlying Cr layer 2 and the overlaying Ni layer 4, and the overlying Ni serves as a metal which wets well with the solder and hardly melts into the solder. As the lowermost layer, the chromium is very excellent to strengthen the bonding force for the silicon substrate. As a result of experiments, a modified example, where the undermost Cr layer is omitted, the Cr-Ni-alloy is formed as the undermost layer and the Ni layer is formed as the second layer, can be practically used though the bonding force is a little lower than the above-mentioned three-layer construction. However, since multiple source electron beam vapor deposition apparatus is easily usable recently, it is of course preferable to provide the undermost Cr layer.

On the three layer metal electrode, which has the Cr layer 2, the Cr-Ni-alloy layer 3 and the Ni layer 4, a noble metal layer 5 is formed, and the substrate with four-layer metal electrodes are bonded by the solder layer 6 on the mounting means 8. For the mounting means 8, copper (Cu) or ferro-nickel-alloy (Fe-Ni-alloy) is suitable, and ordinarily a suitable plated layer, for example Ni-plated layer, is formed in order to afford a good wetting with the solder 6.

The inventors made an intensive research to find more stability than Ni and has a good wetting to solder, and after many experiments found that, as the metal layer to contact the solder layer a noble metal, selected from a group consisting of gold, silver and platinum is suitable. Also, palladium is suitable as the noble metal.

And also it is found that, when gold or platinum is used as the uppermost layer 5 on the Ni layer 4, the effect of the noble metal is observable from the thickness of 500Å–1000Å. When silver is used as the uppermost layer 5 on the Ni layer 4, the effect is observable a thickness above 1000Å, and the effect is remarkable above 3000Å.

Further, it is confirmed that, by providing the noble metal layer as the uppermost layer, it prevents formation of undesirable hard and brittle Sn-Ni compound through a reaction of tin (Sn) in the solder and Ni in the metal electrode. The brittle Sn-Ni compound hitherto has given an undesirable effect to the thermal fatigue characteristic, and accordingly, the prevention of forming of Sn-Ni compound greatly improves thermal fatigue characteristic of power transistors or the like devices.

Furthermore, the inventors made a research on the contents of solder of two kinds, one contains Pb as host material and the other contains Sn as host material. Through experiments, the inventors confirmed that:

(i) For solders having Pb as host material, when a Pb/Sn two-components composition solder contains 2–10 wt % of Sn and the rest part is Pb, the above-mentioned advantageous characteristics are observed, and (ii) For solders having Sn as host material, when a Sn/Ag/Sb three-components composition solder contains 2–10 wt % of Ag, 0.1–20 wt % of Sb and the rest part is Sn, the above-mentioned advantageous characteristics are observed.

For solder having Pb as host material, when the Sn content is lower than. 2 wt %, the fluidity of molten solder is not satisfactory and impractical for usage. On the other hand, when Sn content is higher than the above-mentioned, the Sn-Ni compound is likely to be formed, and for over 10 wt % of Sn, the thermal fatigue becomes noticeable. In the solder containing Sn as host content, when Ag is added its fluidity improves, thereby decreasing voids. However, when contents of Ag increases over 10 wt %, the solder becomes brittle; and when the content is under 2 wt %, the effect of Ag is not observed. Therefore the contents of Ag should be between 2 to 10 wt %. Also, in the Sn-hosting solder, an addition of Sb improves oxidation-prevention effect. The contents of Sb should be under 20 wt % in order not to make the solder impractically brittle, but under 0.1 wt % no effect is obtainable.

The solder containing Pb as host content is more suitable for semiconductor devices which are raised to relatively high temperatures, while the solder containing Sb as host content is more suitable for semiconductor devices which are used at relatively low temperature. Experiments proved that there is no significant difference between the electric characteristics of the semiconductor devices using the Pb-hosting solder and the Sb-hosting solder.

The multilayered metal electrode structure used in the semiconductor substrate in accordance with the present invention has showed the following features:

(1) There is substantially no voids at the solder layer as a result of good wetting of the noble metal to the solder layer.

(2) Effective bonding area increases as a result of decrease of voids, resulting in decrease of thermal resistance by 10 to 20%.

(3) Secondary breakdown voltage increases by about 10% thereby increasing reliability.

(4) Bonding force is drastically increased.

(5) Control of manufacturing in the soldering step becomes easier.

(6) Formation of undesirable brittle Sn-Ni compound is suppressed, thereby improving resistivity to thermal fatigue.

(7) Oxidation of the surface of the multilayered electrode is eliminated, thereby enabling dispensing with of necessity of the preliminary treatment before the soldering.

Therefore, as a result of the above features, the present invention is advantageous in improving easiness of the fabricating process and also improves electrical, mechanical and life-time characteristics of the devices.

What is claimed is:

1. A contact structure for a semiconductor substrate on a mounting body, for a high-power semiconductor device comprising:

a semiconductor substrate, a multilayered electrode formed on a surface of said semiconductor substrate, said multilayered electrode comprising a chromium layer formed on said surface, a chromium-nickel alloy layer formed thereon, a nickel layer formed thereon and a noble metal layer of a metal selected from a group consisting of gold, silver, platinum and palladium formed further thereon, a solder layer and a mounting means for holding said semiconductor substrate thereon, said solder layer soldering said multilayered electrode onto said mounting means, thereby bonding said semiconductor substrate onto said mounting means.

2. A semiconductor device in accordance with claim 1, wherein said solder is of a contents that 2–10 wt % is Sn and the rest part is lead.

3. A semiconductor device in accordance with claim 1, wherein said solder is of a contents that 2–10 wt % is silver, 0.1–20 wt % is antimony and the rest part is tin.

4. A semiconductor device in accordance with claim 1, wherein said noble metal layer is made of one material selected from the group consisting of gold and platinum, having a thickness of 500Å–3000Å.

5. A semiconductor device in accordance with claim 1, wherein said noble metal layer is made of silver having a thickness of over 1000Å.

6. A semiconductor device in accordance with claim 1, wherein said noble metal layer is made of silver having a thickness of over 3000Å.

* * * * *